United States Patent [19]
Jenq

[11] Patent Number: 5,851,876
[45] Date of Patent: Dec. 22, 1998

[54] METHOD OF MANUFACTURING DYNAMIC RANDOM ACCESS MEMORY

[75] Inventor: Jason Jenq, Pingtung, Taiwan

[73] Assignee: United Microelectronics Corp., Hsinchu, Taiwan

[21] Appl. No.: 79,254

[22] Filed: May 14, 1998

[30] Foreign Application Priority Data

Mar. 18, 1998 [TW] Taiwan ................................ 87104002

[51] Int. Cl.⁶ ............................................. H01L 21/8242
[52] U.S. Cl. ............................ 438/253; 438/254; 438/397
[58] Field of Search ..................................... 438/253, 254, 438/256, 396, 397, 399

[56] References Cited

U.S. PATENT DOCUMENTS

| | | | |
|---|---|---|---|
| 5,128,273 | 7/1992 | Ema | 438/253 |
| 5,135,883 | 8/1992 | Bae et al. | 438/396 |
| 5,677,222 | 10/1997 | Tseng | 438/253 |
| 5,706,164 | 1/1998 | Jeng | 438/253 |
| 5,770,499 | 6/1998 | Kwok et al. | 438/396 |
| 5,807,782 | 9/1998 | Koh et al. | 438/396 |

*Primary Examiner*—Tuan H. Nguyen
*Attorney, Agent, or Firm*—Thomas, Kayden, Horstemeyer & Risley, L.L.P.

[57] ABSTRACT

A method of forming DRAMs that utilizes cap layers and spacers to surround the gate and bit line so that the necessary contact openings in DRAM can be formed in two self-aligned contact opening processing operations. Furthermore, the DRAM capacitor is formed by alternately depositing two types of insulating layers, one over the other, with each insulating layer having a different etching rate, and then performing an etching operation. Therefore, a deer antler-shaped mold is formed that can ultimately be used to fabricate a storage electrode with a large surface area.

27 Claims, 9 Drawing Sheets

METHOD OF MANUFACTURING DYNAMIC RANDOM ACCESS MEMORY

CROSS-REFERENCE TO RELATED APPLICATION

This application claims the priority benefit of Taiwan application Ser. No. 87/104,002, filed Mar. 18, 1998, the full disclosure of which is incorporated herein by reference.

BACKGROUND OF THE INVENTION

1. Field of Invention

The present invention relates to a method of manufacturing integrated circuits. More particularly, the present invention relates to a method of manufacturing dynamic random access memory (DRAM).

2. Description of Related Art

Figure 1:
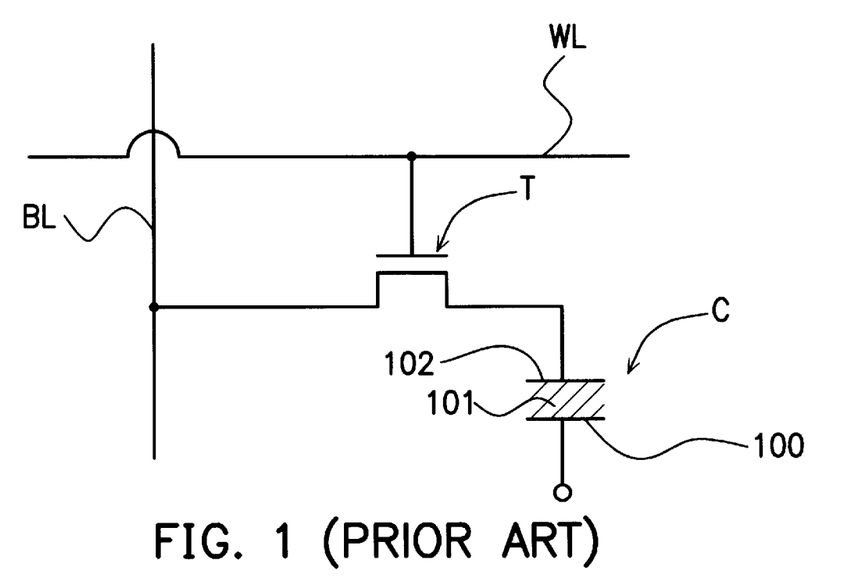
FIG. 1 is an equivalent circuit diagram of a DRAM cell.

As the microprocessor of a computer becomes more powerful, the amount of software programs that can be simultaneously run inside a computer increase exponentially. Consequently, the amount of memory space necessary for storing data must be increased, and so highly efficient memory capacitors are in great demand. As the level of integration of DRAM increases, DRAM cells are now constructed from just one transfer field effect transistor and a storage capacitor. FIG. 1 is an equivalent circuit diagram of a DRAM cell. A DRAM is normally constructed from an array of these cells. A binary bit is stored in the capacitor C of each cell. In general, when the capacitor C is uncharged, a logic state of "0" is defined. On the other hand, when the capacitor C is fully charged, a logic state of "1" is defined. A capacitor C has an upper electrode (cell electrode) 102 and a lower electrode (storage electrode) 100 with a layer of dielectric 101 sandwiched between the two to provide the necessary dielectric constant. In addition, the capacitor C is coupled to a bit line (BL), and reading and writing to and from the DRAM memory is achieved by charging or discharging the capacitor C. Charging and discharging of the capacitor is carried out through the control of a transfer field effect transistor (TFET). The source terminal of the transfer transistor is connected to the bit line BL while the drain terminal of the transfer transistor is connected to the capacitor C. The transfer transistor is switched on or off through a selection signal coming from a word line WL, which is connected to the gate terminal of the transfer transistor. Hence, whether the capacitor C is connected to the bit line allowing for charging or discharging of the capacitor depends upon the selection signal passed to the gate terminal.

The capacitor can be regarded as the heart of a DRAM structure. When the quantity of electric charges stored in a capacitor is increased, data amplified out from memory will be less affected by noise surrounding the communication system. In general, the charge storage capacity of a capacitor can be increased in several ways, including: 1. choosing a material having a high dielectric constant to form the dielectric film layer; 2. reducing the thickness of the dielectric film layer; and 3. increasing the surface area of a capacitor. Nowadays, many materials with high dielectric constants have been developed, including tantalum pentoxide ($Ta_2O_5$), $Pb(Zr,Ti)O_3$ or PZT and $(Ba,Sr)TiO_3$ or BST. To increase the surface area of a capacitor, three-dimensional capacitors such as the so-called stacked type and trench type are now commonly used. For a 64 Mbit DRAM, for example, one method of further increasing the surface area of a capacitor is to extend the electrode and dielectric film layer horizontally and then stack the layers up to form a fin-type stacked capacitor. An alternative method is to allow the electrode and the dielectric film layer to extend vertically up to form a cylindrical-type stacked capacitor. Description related to the formation of a fin-type capacitor can be found in an article by Ema et al. with the title "3-Dimensional Stacked Capacitor Cell for 16M and 64M DRAMs," published in International Electron Devices Meeting, pp 592–595, December 1988, or U.S. Pat. No. 5,071,783, U.S. Pat. No. 5,126,810 and U.S. Pat. No. 5,206,787. Descriptions related to the formation of a cylindrical-type capacitor can be found in another article by Wakamiya et al. with the title "Novel Stacked Capacitor Cell for 64Mb DRAM" published in Symposium on VLSI Technology Digest of Technical Papers, pp 69–70, 1989, or U.S. Pat. No. 5,077,688.

Figure 2:
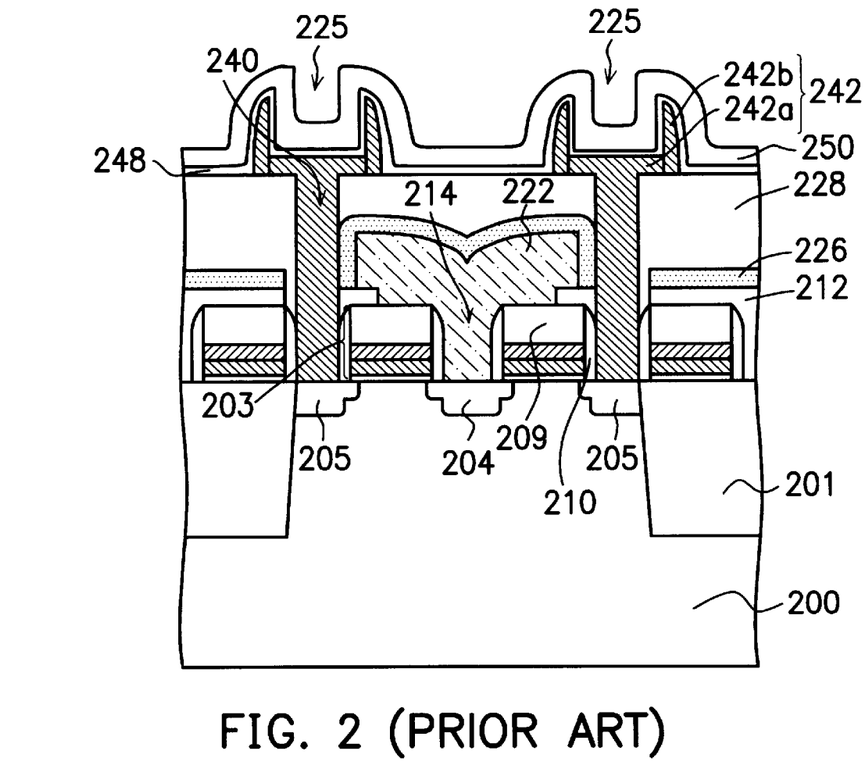
FIG. 2 is a cross-sectional view showing a DRAM having a conventional cylindrical capacitor.

FIG. 2 is a cross-sectional view showing a DRAM having a conventional cylindrical capacitor. DRAM is constructed above the surface of a substrate 200 within a specially-defined active region that is surrounded by isolating insulator 201. The field effect transistor of a DRAM includes a gate structure 203 and source/drain regions 204 and 205. The gate structure 203 includes a cap layer 209 on top and sidewall spacers 210 on each side, while the bit line 222 is electrically coupled with the source/drain region 204 of the transistor. The bit line 222 is formed by first forming a dielectric layer 212 over the substrate 200, and then forming a self-aligned contact opening 214 using conventional photolithographic and etching processes. Finally, a conductive layer is deposited filling the contact opening 214 followed by patterning the conductive layer to form the bit line 222. The storage electrode 242 of the capacitor 225 is formed by first depositing a silicon oxide layer 226 over the substrate 200, and then depositing a borophosphosilicate glass (BPSG) layer 228 to form a planar surface. Next, the BPSG layer 228 and the silicon oxide layer 226 are patterned to form the contact opening 240. Subsequently, a polysilicon layer 242a and another borophosphosilicate layer (not shown in the Figure) are formed, patterned and then doped. Thereafter, another doped polysilicon layer is formed over the substrate 200 and then etched back to form doped polysilicon sidewall spacers 242b. Next, the borophosphosilicate glass layer is removed to expose the doped polysilicon layers 242a and 242b. The exposed polysilicon layers 242a and 242b together constitute the storage electrode 242. Finally, a dielectric thin film 248 and a conductive layer 250 are formed sequentially over the substrate 200 to complete the formation of a DRAM capacitor 225.

In etching the borophosphosilicate glass layer 228 and the silicon oxide layer 226 to form the contact opening 240 of the cylindrical capacitor, position of the opening 240 can shift somewhat due to the inherent difficulties in aligning a narrow width using conventional photolithographic techniques. In some cases, if shifting is severe, etching may result in actual damage of the bit line 222. When the bit line 222 is damaged, subsequent deposition of polysilicon material into the contact opening 240 may lead to the production of short-circuiting contact with the bit line 222.

Furthermore, although the cylindrical-shaped storage electrode 242 of the capacitor 225 is able to increase the capacitance of the memory structure a little, the increase in capacitance may be less than the degree of shrinkage in device area due to a higher level of integration. In light of the foregoing, there is a need to improve the method of fabricating dynamic random access memory and its capacitor.

SUMMARY OF THE INVENTION

Accordingly, the present invention is to provide a method of forming bit lines suitable for high-level integration of DRAM structures and capable of preventing damages that may arise due to subsequent etching of a neighboring dielectric layer to form a contact opening.

In another aspect, this invention provides a method of fabricating the capacitor of DRAM that utilizes the difference in etching rate between different materials. Using the method, the effective surface area of a DRAM capacitor and hence its capacitance can be increased considerably even on a very small surface area.

To achieve these and other advantages and in accordance with the purpose of the invention, as embodied and broadly described herein, the invention provides a method of manufacturing a DRAM capacitor. The method comprises the steps of first providing a substrate having a field effect transistor formed thereon and then forming a dielectric layer over the substrate. Next, the dielectric layer is patterned to form a self-aligned contact opening exposing one of the source/drain regions of the field effect transistor. Thereafter, a conductive layer and an insulating layer are sequentially formed over the dielectric layer, and then the conductive layer and the insulating layer are patterned to form a bit line that has an insulating cap layer on top. Subsequently, a silicon nitride layer is formed over the substrate, and then the silicon nitride layer is etched back to form spacers on the sidewalls of the bit line. The sidewall spacers are capable of protecting the bit line against subsequent etching to form a self-aligned contact opening of the capacitor. Next, a silicon oxide layer is formed over the substrate, and then a borophosphosilicate glass layer is deposited over the silicon oxide layer to form a planar surface. Thereafter, an etching stop layer is formed over the borophosphosilicate glass layer, and then a stack of sacrificial layers are formed on top of the etching stop layer. The stack of sacrificial layers is formed by alternately depositing a first insulating layer and then a second insulating layer one upon the other. Subsequently, the stack of sacrificial layers is patterned to form a wide opening exposing a portion of the etching stop layer. Next, a wet etching is performed utilizing an etchant that has different etching rates for the first insulating layer and the second insulating layer. Consequently, a gear-teeth profile is obtained on the exposed sacrificial layers of the wide opening. Thereafter, the etching stop layer, the borophosphosilicate glass layer and the dielectric layer are patterned to form a self-aligned contact opening that exposes another source/drain region of the transistor. Then, a conductive layer is formed over the substrate at least covering the gear-teeth profile of the wide opening and completely filling the self-aligned contact opening so that the source drain region is electrically connected. Next, the sacrificial layers are removed to expose the conductive layer, and then a dielectric thin film is formed over the exposed conductive layer. Finally, another conductive layer is formed over the dielectric thin film acting as a cell electrode.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings.

Wherever possible, the same reference numbers are used in the drawings and the description to refer to the same or like parts.

FIGS. 3A through 3M are cross-sectional views showing the progression of manufacturing steps in forming a DRAM capacitor according to one preferred embodiment of this invention.

Figure 3A:
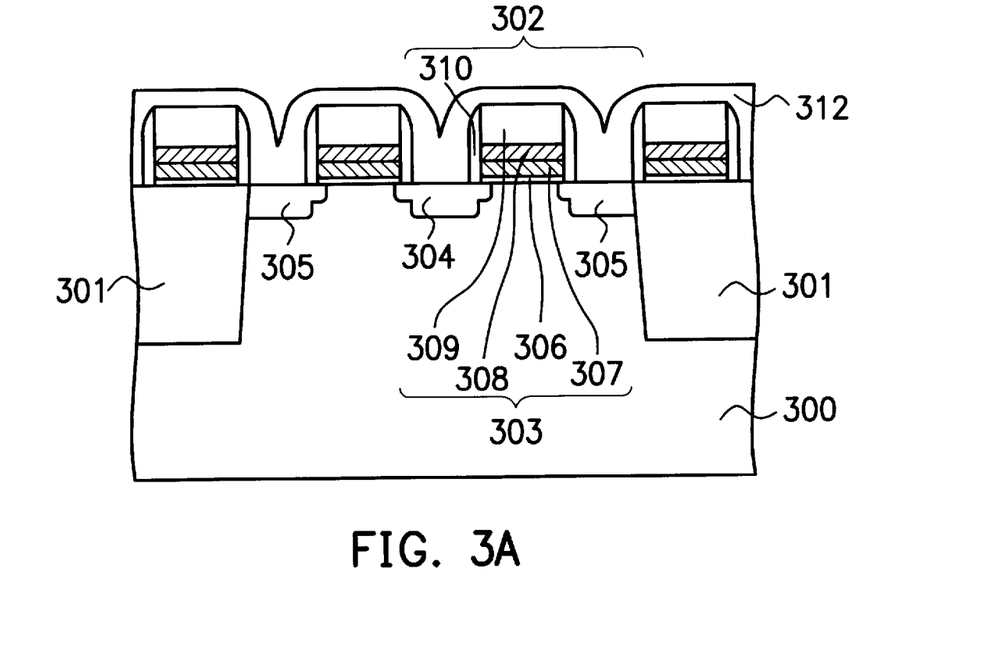
FIGS. 3A through 3M are cross-sectional views showing the progression of manufacturing steps in forming a DRAM capacitor according to one preferred embodiment of this invention.

First, as shown in FIG. 3A, a substrate 300, for example, P-type silicon substrate is provided. Next, insulating layers 301 are formed on the substrate 300 defining a device region, and then a DRAM field effect transistor 302 is formed in the device region. The field effect transistor 302 includes a gate 303 and source/drain regions 304 and 305. The gate has a composite structure that includes a gate oxide layer 306, a doped polysilicon layer 307, a metal silicide layer 308 such as tungsten silicide ($WSi_2$), and a cap layer such as silicon nitride ($SiN_x$, each having thickness of about 100 Å, 1000 Å, 1000 Å and 2000 Å respectively. In addition, spacers 310 are formed on the sidewalls of the gate structure 303. The spacers 310 are formed by first depositing a layer of silicon nitride having a thickness of about 1500 Å over the substrate 300 and the gate structure 303, and then etching back the silicon nitride layer. Thereafter, a dielectric layer 312 is formed over the substrate 300 structure. The dielectric layer 312 preferably having a thickness of about 1000 Å to 2000 Å is formed, for example, by depositing silicon oxide using a chemical vapor deposition (CVD) method.

Figure 3B:
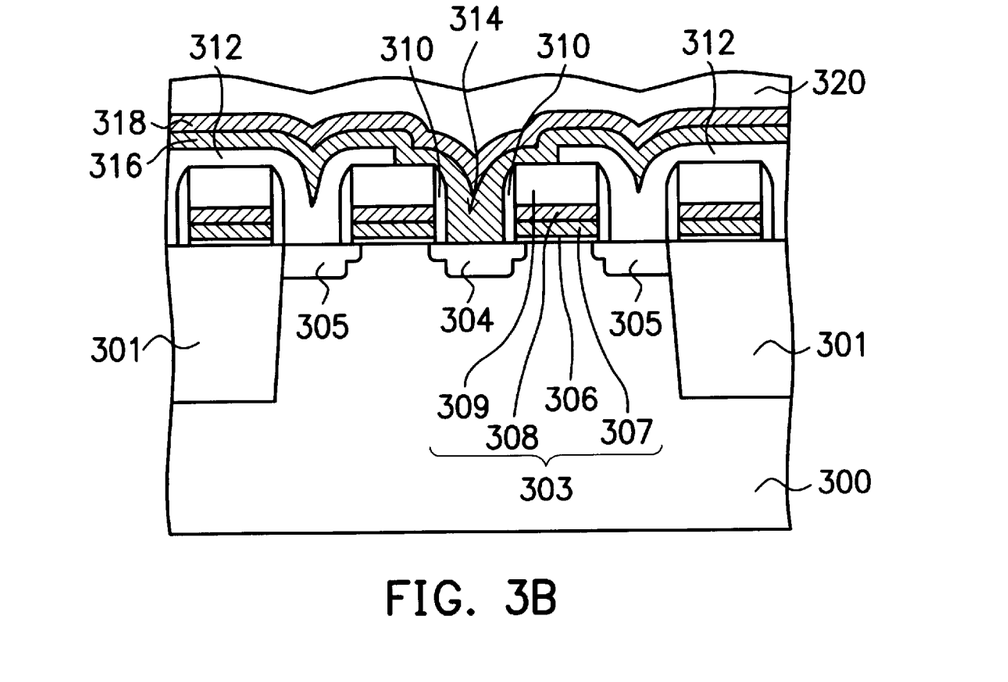

Next, as shown in FIG. 3B, the dielectric layer 312 is patterned to form a self-aligned contact opening 314 exposing a source/drain region 304. Subsequently, a conductive layer is formed over the substrate structure 300 and completely fills the self-aligned contact opening 314 so as to make electrical connection with the source/drain region 304. The conductive layer has a composite structure that includes a doped polysilicon layer 316 and a metal silicide layer 318 on top. The doped polysilicon layer 316, preferably having a thickness of about 1000 Å, can be formed using, for example, a low-pressure chemical vapor deposition (LPCVD) method. The metal silicide layer 318, preferably having a thickness of about 1000 Å, can be a tungsten silicide, cobalt silicide or titanium silicide layer. Next, a cap layer 320 is formed over the substrate 300 structure. The cap layer 320, preferably having a thickness of about 2000 Å, is formed, for example, by depositing silicon nitride using a chemical vapor deposition method.

Figure 3C:
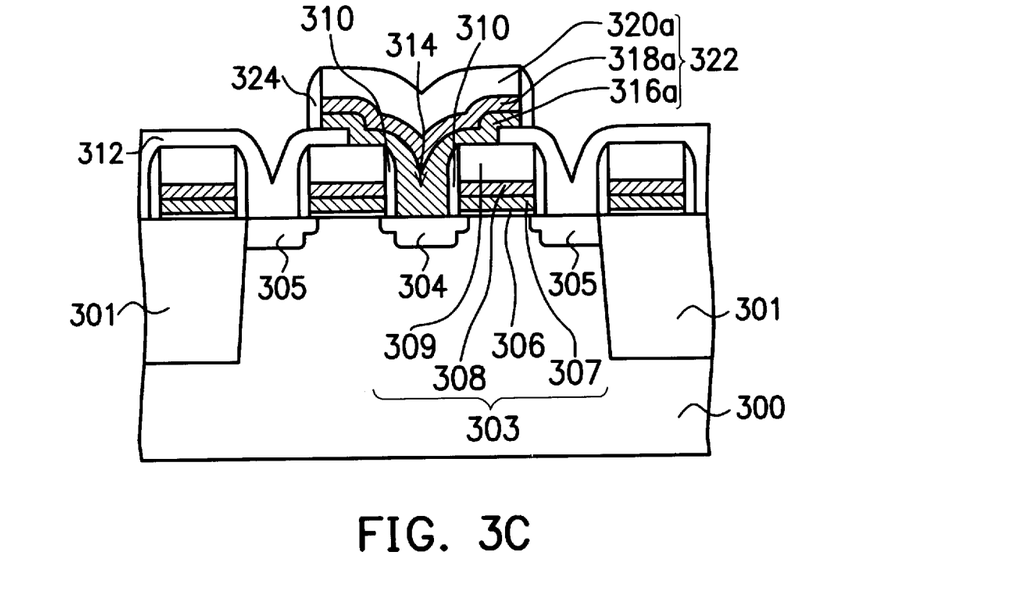

Thereafter, as shown in FIG. 3C, the cap layer 320, the metal silicide layer 318 and the doped polysilicon layer 316 are patterned to form a cap layer 320a, a metal silicide layer 318a and doped polysilicon layer 316a. The cap layer 320a, the metal silicide layer 318a and the doped polysilicon layer 316a together constitute a bit line 322. Next, spacers 324 are formed on the sidewalls of the bit line 322. The spacers 324 are formed by depositing silicon nitride over the substrate structure to a thickness of about 1500 Å, and then performing an anisotropic etching operation. One of the major characteristics of this invention is that the bit line 322 has a cap layer 320a on top and spacers 324 on its sides. In this manner, the bit line 322 is not only fully protected by the surrounding cap layer 320a and spacers 324, but the surrounding layers can also serve as a guide in subsequent formation of a self-aligned contact opening. Consequently, this invention is capable of avoiding photolithographic alignment problems arising from an increase in the level of integration.

Figure 3D:
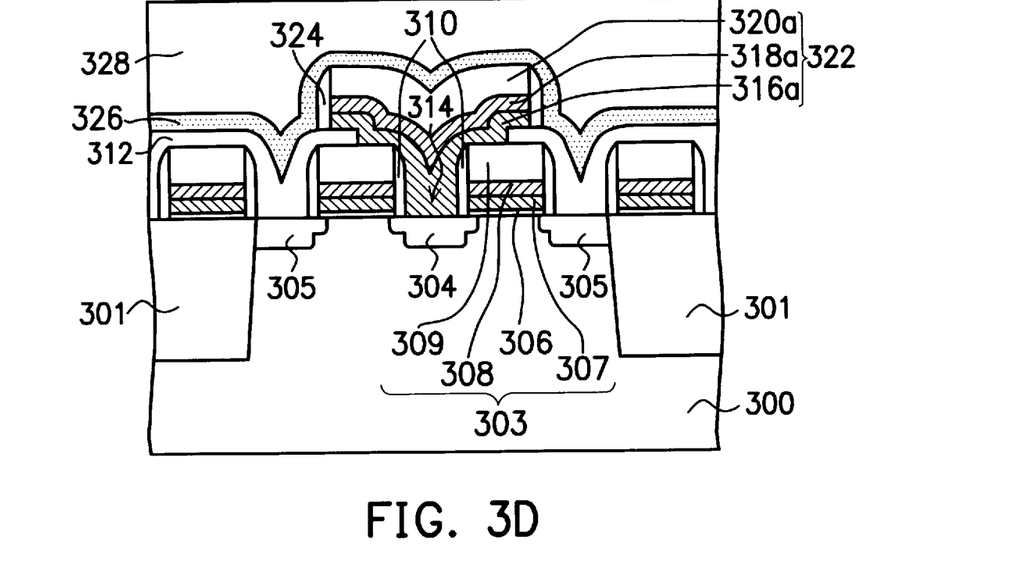

Next, as shown in FIG. 3D, a dielectric layer 326 is formed over the substrate 300 structure. The dielectric layer 326 preferably having a thickness of about 2000 Å is formed, for example, by depositing silicon oxide using an atmospheric pressure chemical vapor deposition method. Thereafter, another dielectric layer 328 for planarizing the substrate structure is deposited over the dielectric layer 326. The dielectric layer 328 can be, for example, a borophosphosilicate glass (BPSG) layer formed by first depositing borophosphosilicate glass over the substrate structure to a thickness of about 7500 Å using a chemical vapor deposition method. Then, the BPSG layer is heated to a temperature of about 800° C. to cause a thermal flow. Finally, the BPSG layer is etched back to obtain a planar dielectric layer 328 having a thickness of about 5000 Å.

Figure 3E:
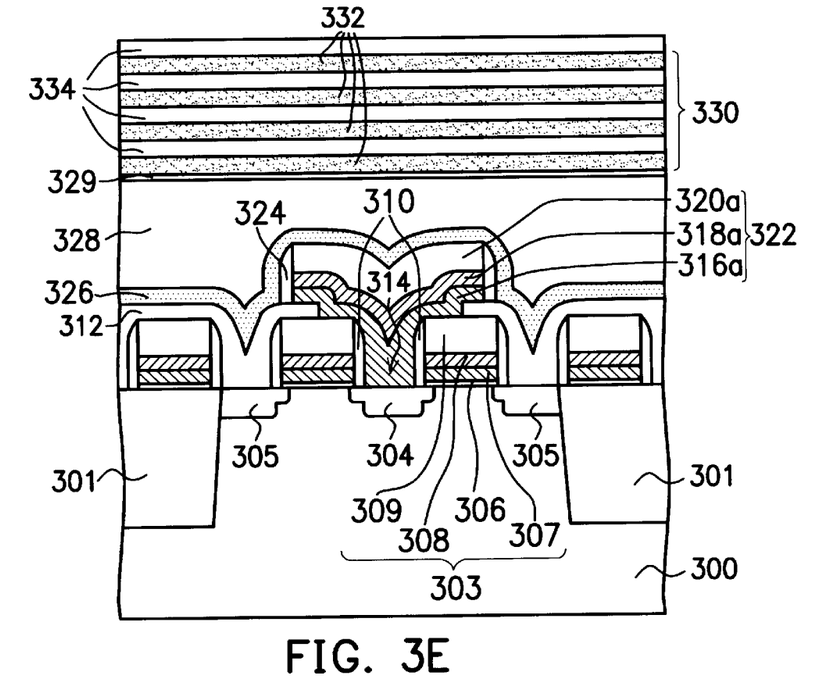

Subsequently, as shown in FIG. 3E, yet another dielectric layer 329 is deposited over the substrate 300 structure. The dielectric layer 329, preferably having a thickness of about 100 Å, is formed, for example, by depositing silicon nitride using low-pressure chemical vapor deposition. Thereafter, a stack 330 of alternately deposited sacrificial layers each having a thickness of about 1000 Å is formed over the substrate structure. The stack of sacrificial layers is formed by alternately depositing a first insulating layer 332 and then a second insulating layer 334, one on top of the other. Each insulating layer has a different etching rate for a given etchant. The method of forming the insulating layers 332 and 334 includes atmospheric pressure chemical vapor deposition, and the material for forming the insulators can be silicon oxide or borophosphosilicate glass.

Figure 3F:
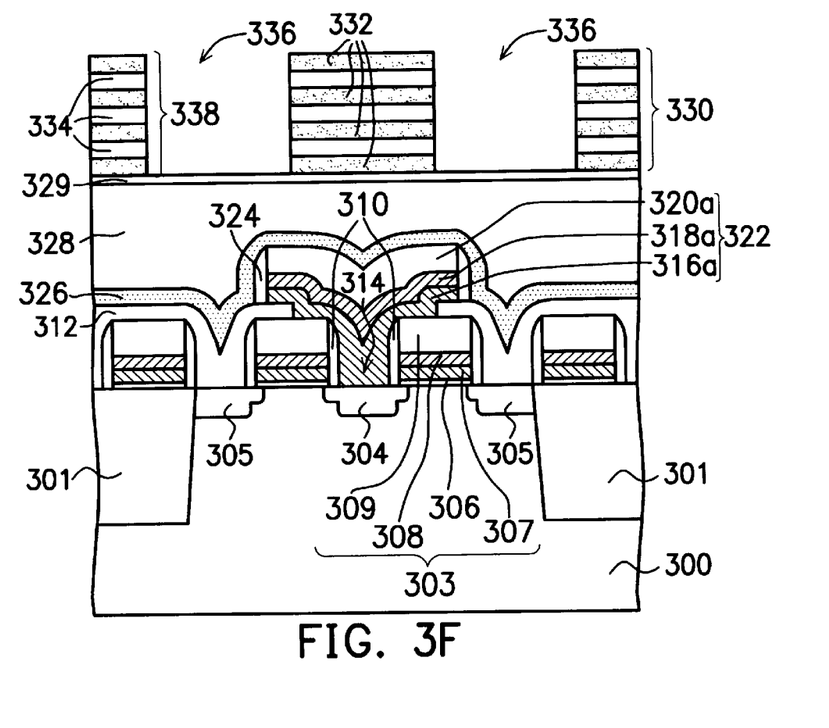

Next, as shown in FIG. 3F, using the dielectric layer 329 as an etching stop layer, conventional photolithographic and etching processes are used to pattern the stack of insulating layers 330 forming a wide opening 336. Since the etching rate between silicon nitride dielectric layer 329 and silicon oxide/BPSG insulating layers 332 and 334 is different, the silicon nitride dielectric layer 329 can function as an etching stop layer. Therefore, the dielectric layer 328 is protected against chemical attack during etching. The wide opening 336 can be formed by an anisotropic etching operation using fluoride-contained gaseous etchants.

Figure 3G:
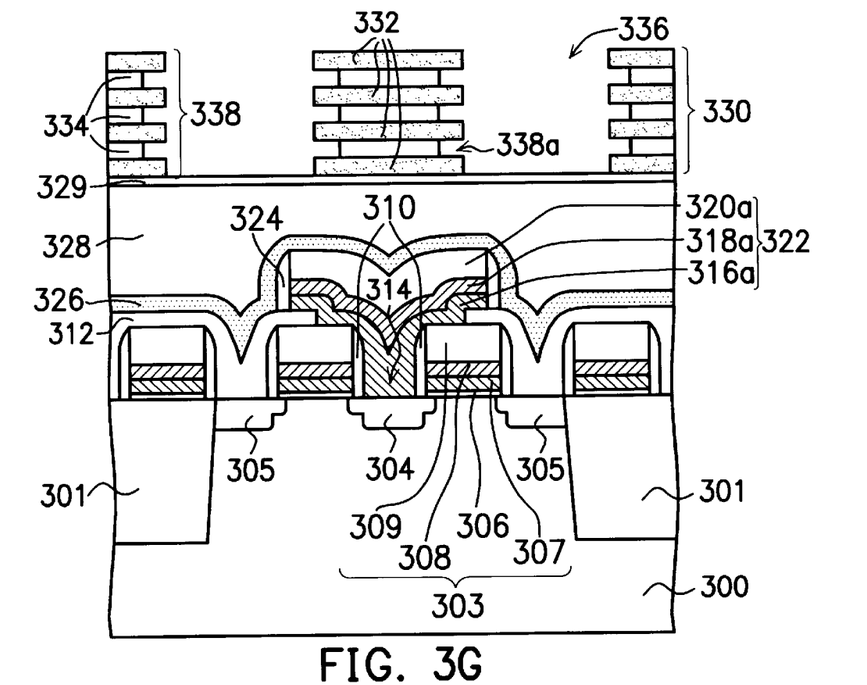

Next, as shown in FIG. 3G, a wet etching is carried out, etching the stack of sacrificial layers 330 to form a "gear-teeth" cross-sectional profile 338 on the sidewalls of the wide opening 336. This represents another innovation of the invention. Since the insulating layers 332 and 334 are formed from different materials, an etchant having different etching rate for the two materials can be selected for the etching operation. After the etching operation, the insulating layers having a higher etching rate will result in the formation of cavities, and the insulating layers having a lower etching rate will form the "gear teeth". In other words, if the insulating layer 334 has a higher etching rate than the insulating layer 332, the insulating layer 334 will be etched more, forming the cavities 338a of the gear-teeth profile 338. On the other hand, if the insulating layer 332 has a higher etching rate than the insulating layer 334, the insulating layer 332 will be etched more forming the cavities 338a of the gear-teeth profile 338 (not shown in the Figure). Normally, a buffered oxide etchant (BOE) is used as the etchant for the above wet etching operation.

Figure 3H:
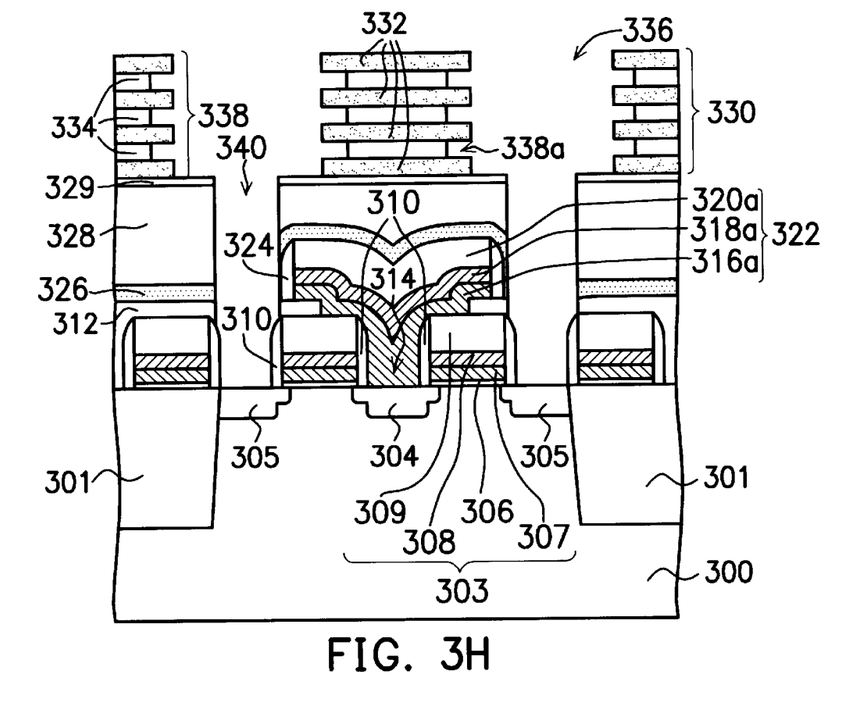

Next, as shown in FIG. 3H, dielectric layers 329, 328, 326 and 312 are patterned to form a self-aligned contact opening 340 that exposes the source/drain region 305. The opening 340 and the gear-teeth profile 338 together forms a mold for the storage electrode. The bit line 322 and the gate 303 both have cap layers 320a and 309, and their sidewalls are covered by spacers 324 and 310. Furthermore, the etching rate of cap layers 320a, 309 and spacers 324, 310 is different from that of the dielectric layers 329, 328, 326 and 312. Therefore, the cap layers 320a and 309 and the spacers 324 and 310 can act not only as a guide in etching the dielectric layers to form the self-aligned contact opening 340, but are also capable of protecting the bit line 322 and the gate 303 against chemical attack during etching. Hence, this invention is able to reduce processing difficulties encountered in photolithographic operation due to an increase in device density.

Figure 3I:
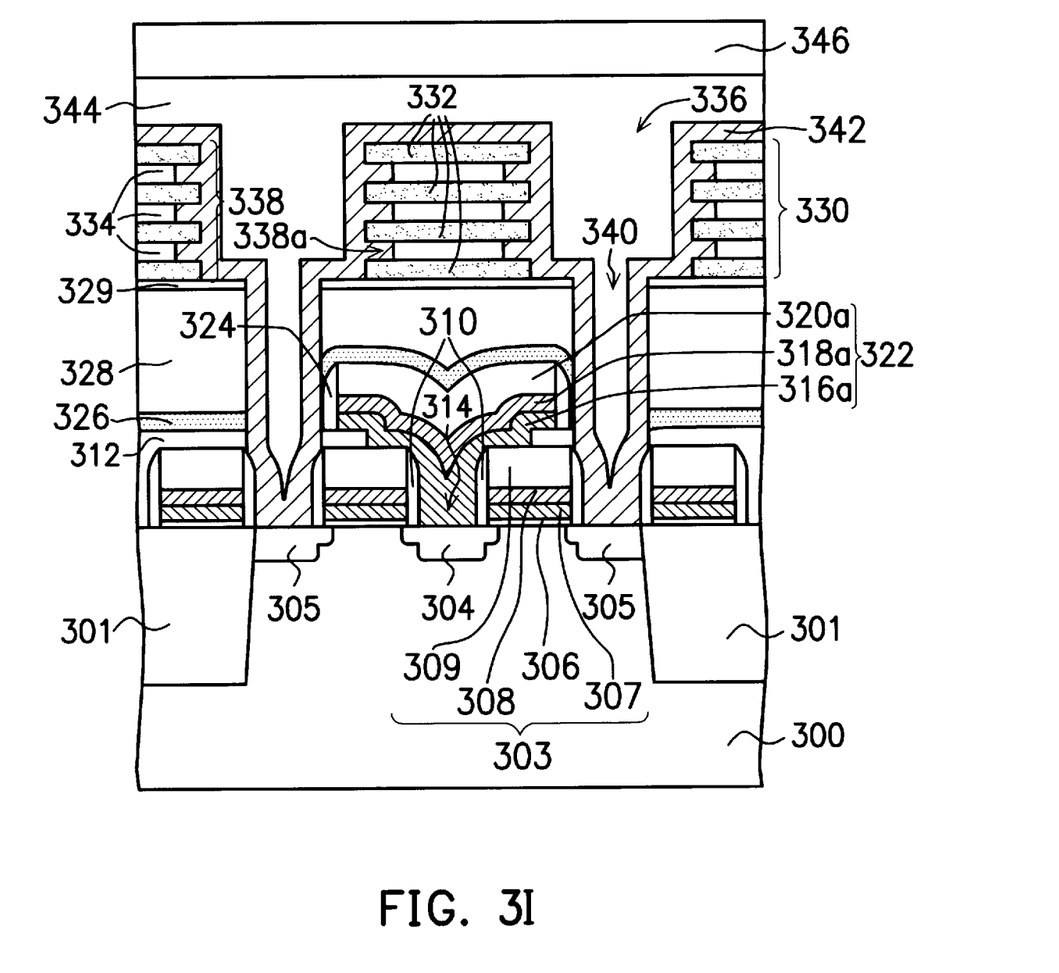

Next, as shown in FIG. 3I, a conductive layer 342, for example, a doped polysilicon layer, is formed over the substrate structure. The conductive layer 342 completely fills the contact opening 340 and at least covers the gear-teeth profile 338 of the sacrificial layers 330. Thereafter, a dielectric layer 344 is formed over the substrate structure. The dielectric layer 344 can be a borophosphosilicate glass layer having a thickness of about 7500 Å. Preferably, a spin-on-glass (SOG) layer 346 having a thickness of about 5400 Å is also formed over the dielectric layer 344. Hence, the surface over the device region is planarized and topographical differences in height levels between the memory cell areas and the peripheral circuit regions are further reduced.

Figure 3J:
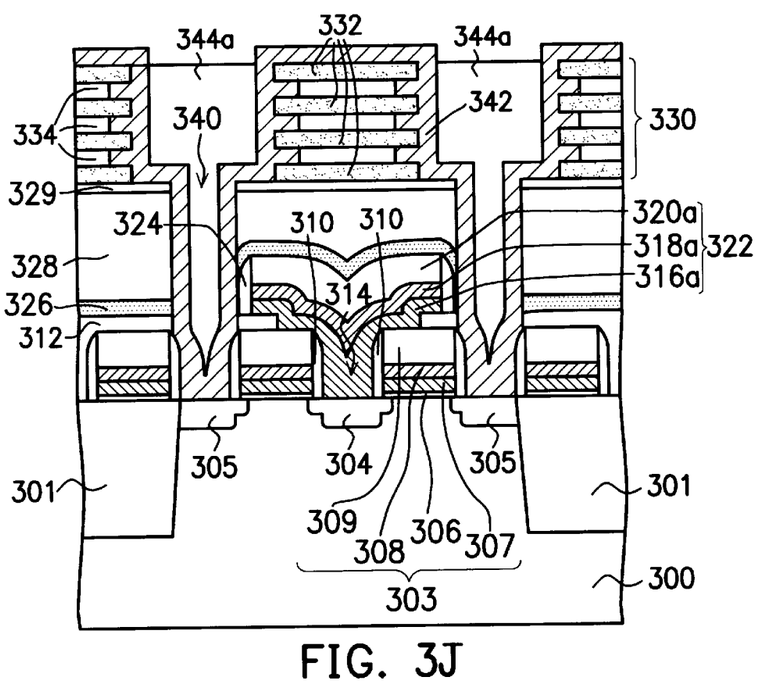

Next, as shown in FIG. 3J, the dielectric layer 344 and the SOG layer 346 are etched back so that a dielectric layer 344a having a thickness of about 3000 Å to 5000 Å still remains in the narrow opening 340. This layer 344a serves to protect the underlying devices against the entrance of contaminants during subsequent processing operation while exposing a portion of the conductive layer 342 in the upper surface of the sacrificial layers.

Figure 3K:
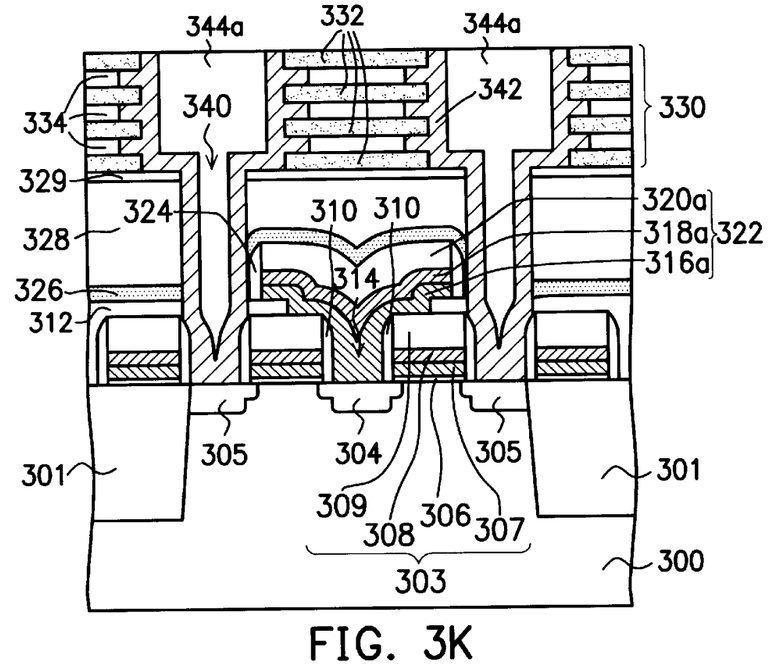

Next, as shown in FIG. 3K, a portion of the conductive layer 342 having a thickness of about 500 Å is removed using, for example, a chemical-mechanical polishing (CMP) method or an etching method so that the upper surface of the sacrificial layers 330 is exposed. When the conductive layer 342 is removed by an etching method, the dielectric layer 344a is able to protect the structure against etching damages. On the other hand, if the conductive layer 342 is removed by a CMP operation, the dielectric layer 344a is capable of preventing contaminants within the slurry from seeping into the opening 340. Such seepage can make cleaning particularly difficult.

Figure 3L:
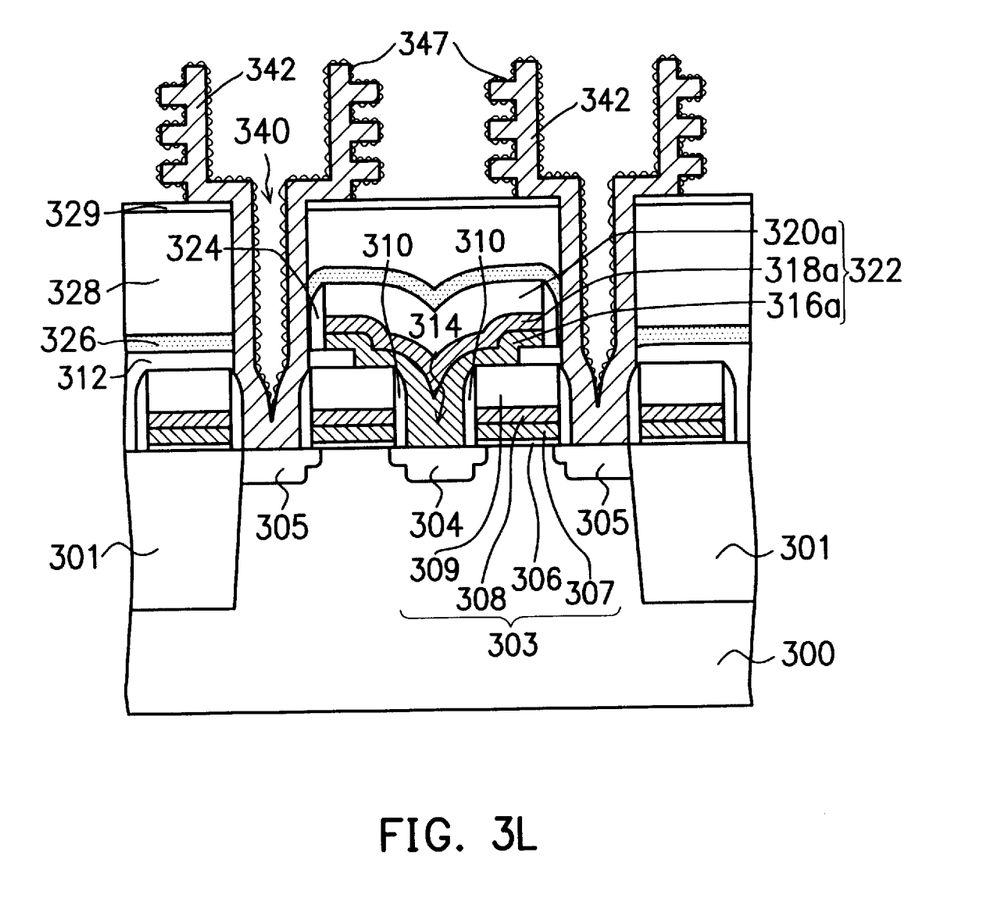

Next, as shown in FIG. 3L, the dielectric layer 344a and the stack of sacrificial layers 330 are removed, exposing the conductive layer 342. For example, using the silicon nitride dielectric layer 329 as an etching stop layer, an isotropic etching operation employing diluted hydrofluoric acid (HF) solution or a buffered oxide etchant is able to simultaneously remove the BPSG dielectric layer 344a, the BPSG insulating layer 334 and the silicon oxide insulating layer 332. A cross-sectional profile of the storage electrode formed by the conductive layer 228 resembles a pair of deer antlers. To increase the storage capacitance of the capacitor even further, a hemispherical-grained silicon (HSG-Si) layer 347 can be formed on the exposed conductive layer 342 to increase overall surface area.

Figure 3M:
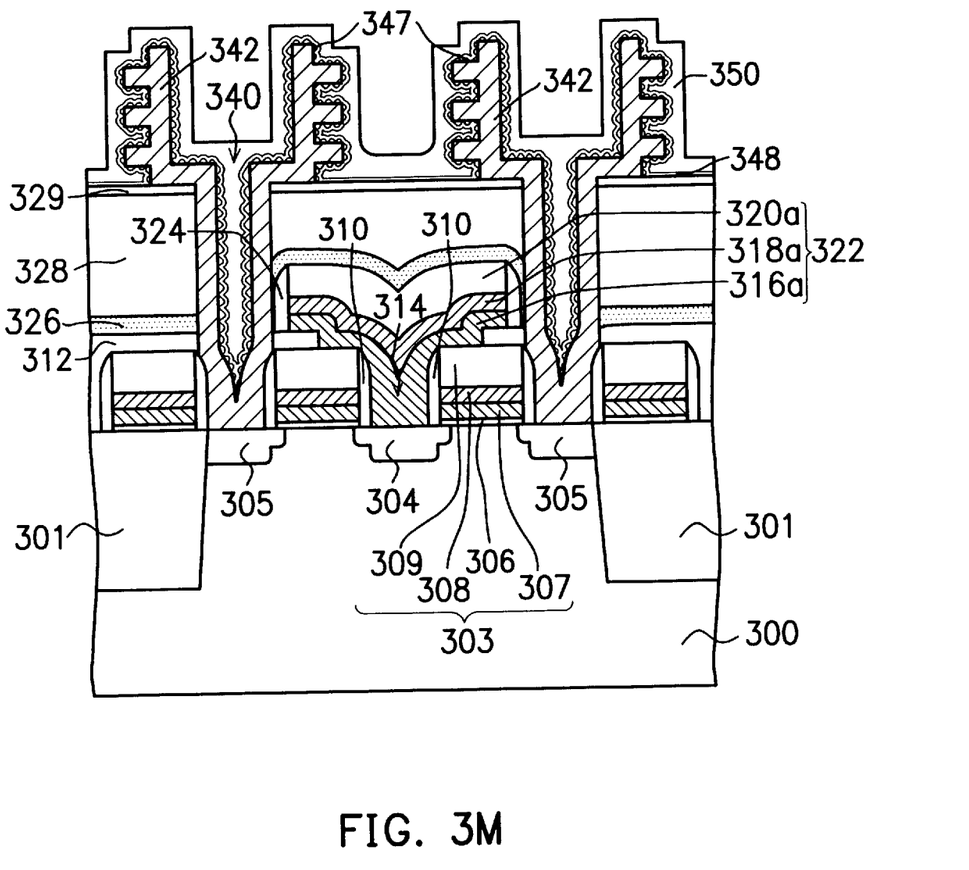

Finally, as shown in FIG. 3M, a dielectric thin film 348 having a thickness of about 10 Å to 60 Å is formed over the HSG-Si layer 347. The dielectric thin film 348 can be a silicon oxide layer, a silicon nitride/silicon oxide (NO) composite layer, a silicon oxide/silicon nitride/silicon oxide (ONO) composite layer, a tantalum pentoxide ($Ta_2O_5$), Pb(Zr, Ti)$O_3$ or PZT and (Ba, Sr)Ti$O_3$ or BST, all of which are made from materials having a high dielectric constant. Thereafter, another conductive layer 350, for example, a metallic layer or a doped polysilicon layer is formed over the dielectric thin film 348 acting as the cell electrode of a capacitor. The conductive layer 350 can be formed by first depositing polysilicon using a chemical vapor deposition, and then doping the polysilicon with N-type impurities such as arsenic ions to increase its electrical conductivity. Alternatively, the conductive layer 350 can be formed by simply depositing a metallic layer such as a titanium nitride layer. Lastly, conventional photolithographic and etching processes are used to pattern the layers into a complete DRAM storage capacitor.

In summary, this invention provides cap layers and spacers that enclose the gate and the bit line so that a second self-aligned contact opening can be formed with ease. Therefore, limitations imposed by a photolithographic operation are very much relieved, and hence this invention is capable of producing a high density of structures. Furthermore, the storage electrode of this invention has a deer antler profile, thereby increasing the surface area of the capacitor. Hence, the charge storage capacity of the DRAM capacitor is greatly increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing dynamic random access memory comprising the steps of:

providing a substrate having a field effect transistor formed thereon, wherein the field effect transistor includes a first source/drain region and a second source/drain region;

forming a bit line electrically coupled with the first source/drain region, wherein the bit line is further covered on top by a cap layer;

forming spacers on the sidewalls of the bit line;

forming a first dielectric layer and a second dielectric layer sequentially over the substrate structure;

forming a stack of patterned sacrificial layers above the second dielectric layer, wherein the stack of sacrificial layers is formed by depositing a first insulating layers and a second insulating layers alternately over each other, and the stack of sacrificial layers have a wide opening that exposes a portion of the second dielectric layer;

performing a wet etching operation so that the stack of sacrificial layers on the sidewalls of the wide opening turns into a gear-teeth cross-sectional profile with a plurality of cavities;

patterning the second dielectric layer and the first dielectric layer to form a self-aligned contact opening that exposes the second source/drain region;

forming a first conductive layer over the substrate structure, wherein the conductive material completely fills the cavities and surface of the gear-teeth profile, as well as completely filling the self-aligned contact opening so that the conductive layer is electrically coupled to the second source/drain region;

using the second dielectric layer as an etching stop layer, removing the sacrificial layers to expose the first conductive layer that becomes a storage electrode forming a dielectric thin film over the exposed first conductive layer; and forming a second conductive layer over the dielectric thin film, wherein the second conductive layer acts as a cell electrode.

2. The method of claim 1, wherein the step of forming the bit line includes sequentially forming a third conductive layer and a third insulating layer over the substrate structure, and then patterning to form the bit line having an overhead cap layer.

3. The method of claim 1, wherein the cap layer and the spacers are formed from material having different etching rate than the first dielectric layer.

4. The method of claim 1, wherein the first dielectric layer is formed from a material having a different etching rate from the second dielectric layer.

5. The method of claim 1, wherein the first insulating layer is formed from a material having a different etching rate from the second insulating layer.

6. The method of claim 5, wherein the step of forming the first insulating layer includes depositing borophosphosilicate glass and the step of forming the second insulating layer includes depositing silicon oxide.

7. The method of claim 6, wherein the step of performing the wet etching operation includes using a buffered oxide etchant.

8. The method of claim 5, wherein the step of forming the first insulating layer includes depositing silicon oxide and the step of forming the second insulating layer includes depositing borophosphosilicate glass.

9. The method of claim 8, wherein the step of performing the wet etching operation includes using a buffered oxide etchant.

10. The method of claim 1, wherein the step of removing the stack of sacrificial layers includes an isotropic etching process.

11. The method of claim 1, wherein after the step of removing the sacrificial layers to expose the first conductive layer, further includes depositing hemispherical-grained silicon over the first conductive layer.

12. The method of claim 1, wherein the step of forming the dielectric thin film includes depositing tantalum pentoxide.

13. The method of claim 1, wherein the step of forming the dielectric thin film includes depositing PZT.

14. The method of claim 1, wherein the step of forming the dielectric thin film includes depositing BST.

15. A method of manufacturing dynamic random access memory comprising the steps of:

providing a substrate having a field effect transistor formed thereon, wherein the field effect transistor includes a first source/drain region and a second source/drain region;

forming a first dielectric layer over the substrate structure;

patterning the first dielectric layer to form a first self-aligned contact opening;

forming a first conductive layer over the substrate structure to form an electrical connection with the first source/drain region;

forming a cap layer over the first conductive layer;

patterning the first conductive layer and the cap layer to form a bit line;

forming spacers on the sidewalls of the bit line;

forming a second dielectric layer and a third dielectric layer sequentially over the substrate structure;

forming a stack of sacrificial layers above the third dielectric layer, wherein the stack of sacrificial layers is formed by depositing first insulating layers and second insulating layers alternately over each other;

patterning the stack of sacrificial layers to form a wide opening exposing a portion of the third dielectric layer;

performing a wet etching operation, wherein the etchant has a different etching rate for the first insulating layer and the second insulating layer so that the stack of sacrificial layers on the sidewalls of the wide opening turns into a gear-teeth cross-sectional profile with a plurality of cavities;

patterning the third dielectric layer, the second dielectric layer and the first dielectric layer to form a second self-aligned contact opening that exposes the second source/drain region;

forming a second conductive layer over the substrate structure, wherein the conductive material completely fills the cavities and surface of the gear-teeth profile, as well as completely filling the second self-aligned contact opening so that the conductive layer is electrically coupled to the second source/drain region;

using the third dielectric layer as an etching stop layer, removing the sacrificial layers to expose the second conductive layer that becomes a storage electrode forming a dielectric thin film over the exposed second conductive layer; and forming a third conductive layer over the dielectric thin film, wherein the third conductive layer acts as a cell electrode.

16. The method of claim 15, wherein the cap layer and the spacers are formed from material having different etching rate than the first dielectric layer.

17. The method of claim 15, wherein the first dielectric layer is formed from a material having a different etching rate from the second dielectric layer.

18. The method of claim 15, wherein the first insulating layer is formed from a material having a different etching rate from the second insulating layer.

19. The method of claim 18, wherein the step of forming the first insulating layer includes depositing borophosphosilicate glass and the step of forming the second insulating layer includes depositing silicon oxide.

20. The method of claim 19, wherein the step of performing the wet etching operation includes using a buffered oxide etchant.

21. The method of claim 18, wherein the step of forming the first insulating layer includes depositing silicon oxide and the step of forming the second insulating layer includes depositing borophosphosilicate glass.

22. The method of claim 21, wherein the step of performing the wet etching operation includes using a buffered oxide etchant.

23. The method of claim 15, wherein the step of removing the stack of sacrificial layers includes an isotropic etching method.

24. The method of claim 15, wherein after the step of removing the sacrificial layers to expose the first conductive layer, further includes depositing hemispherical-grained silicon over the first conductive layer.

25. The method of claim 15, wherein the step of forming the dielectric thin film includes depositing tantalum pentoxide.

26. The method of claim 15, wherein the step of forming the dielectric thin film includes depositing PZT.

27. The method of claim 15, wherein the step of forming the dielectric thin film includes depositing BST.

* * * * *